(12) United States Patent
Lassiter et al.

(10) Patent No.: US 6,855,463 B2
(45) Date of Patent: Feb. 15, 2005

(54) PHOTOMASK HAVING AN INTERMEDIATE INSPECTION FILM LAYER

(75) Inventors: Matthew Lassiter, McKinney, TX (US); Michael Cangemi, McKinney, TX (US)

(73) Assignee: Photronics, Inc., Brookfield, CT (US)

( * ) Notice: Subject to any disclaimer, the term of this patent is extended or adjusted under 35 U.S.C. 154(b) by 70 days.

(21) Appl. No.: 10/229,830

(22) Filed: Aug. 27, 2002

(65) Prior Publication Data

US 2004/0043303 A1 Mar. 4, 2004

(51) Int. Cl.⁷ .............................. G03F 9/00; G03C 5/00
(52) U.S. Cl. ........................................ 430/5; 430/311
(58) Field of Search ........................ 430/5, 322, 311; 428/426, 428

(56) References Cited

U.S. PATENT DOCUMENTS

| | | | |
|---|---|---|---|
| 3,900,737 A | | 8/1975 | Collier et al. |
| 5,415,953 A | * | 5/1995 | Alpay et al. ................. 430/5 |
| 5,482,799 A | | 1/1996 | Isao et al. |
| 5,563,702 A | | 10/1996 | Emery et al. |
| 5,618,643 A | | 4/1997 | Dao et al. |
| 5,851,706 A | | 12/1998 | Lim et al. |
| 5,897,977 A | | 4/1999 | Carcia et al. |
| 5,935,733 A | | 8/1999 | Scott et al. |
| 5,935,735 A | | 8/1999 | Okubo et al. |
| 6,042,995 A | | 3/2000 | White |
| 6,087,047 A | | 7/2000 | Mitsui et al. |
| 6,096,460 A | | 8/2000 | French et al. |
| 6,110,623 A | | 8/2000 | O'Grady et al. |
| 6,127,069 A | | 10/2000 | Balz et al. |
| 6,153,341 A | | 11/2000 | Mitsui et al. |
| 6,174,631 B1 | | 1/2001 | French et al. |
| 6,228,541 B1 | | 5/2001 | Isao et al. |
| 6,569,577 B1 | * | 5/2003 | Isao et al. ................. 430/5 |
| 2003/0064297 A1 | * | 4/2003 | Shiota et al. ................. 430/5 |

FOREIGN PATENT DOCUMENTS

| | | |
|---|---|---|
| JP | 01-026820 A2 | 1/1989 |
| JP | 04-262411 | 9/1992 |
| JP | 04-316048 | 11/1992 |
| JP | 05-134387 | 5/1993 |
| JP | 08-304998 A | 11/1996 |
| JP | 11-237726 | 8/1999 |
| JP | 020000-10255 A | 1/2000 |

* cited by examiner

*Primary Examiner*—S. Rosasco
(74) *Attorney, Agent, or Firm*—Amster, Rothstein & Ebenstein LLP

(57) ABSTRACT

The present invention relates generally to improved photomask blanks used in photolithography for the manufacture of integrated circuits and other semiconductor devices, and more specifically, to the detection of defects in such photomasks after processing. In particular, the present invention is directed to a photomask blank having one or more intermediate layers made from materials having a higher extinction coefficient at the inspection tool wavelength than exposure tool wavelengths. The intermediate layer(s) are made from materials that absorb a sufficient amount of light to meet the optical requirements of inspection tools while at the same time transmit a sufficient amount of light to meet the optical requirements of exposure tools. As a result, the photomask improves inspection results of a photomask without sacrificing transmission properties during the semiconductor writing process.

72 Claims, 10 Drawing Sheets

SILICON WAFER → DEPOSITION → PHOTOLITHOGRAPHIC IMAGING → ETCH

Transmission of TaSiN with Ti inspection layer for 193nm EAPSM

Transmission of Al-TaSiN-Al (dual inspection layer) for 193nm EAPSM

PHOTOMASK HAVING AN INTERMEDIATE INSPECTION FILM LAYER

FIELD OF THE INVENTION

The present invention relates generally to an improved photomask used in photolithography for the manufacture of integrated circuits and other semiconductor devices, and more specifically, to the detection of defects in such photomasks after processing. In particular, the present invention is directed to a photomask, either blank or processed, having one or more intermediate layers deposited therein to improve inspection results of the photomask without sacrificing transmission properties at the exposure tool wavelength. Additionally, the present invention is directed to semiconductors or other integrated circuits manufactured using the improved photomask of the present invention.

BACKGROUND OF THE INVENTION

Photomasks are high precision plates containing microscopic images of electronic circuits. Photomasks are typically made from flat pieces of quartz or glass with a layer of chrome on one side. Etched in the chrome is a portion of an electronic circuit design, often referred to as "geometry". Photomasks are used in wafer fabrication, mainly to make integrated circuits ("ICs") and other semiconductor devices. In turn, ICs are used in a variety of different products, including computers, calculators, cars, cameras, stereos, etc. Photomasks are also used to make flat panel displays, thin film heads, PC boards, and other electronic products.

One type of photomask known in the art is an embedded attenuated phase shift mask ("EAPSM"). EAPSMs are used in the production of semiconductor devices, and more particularly, EAPSMs are typically used to print contact layer holes in a semiconductor wafer. As shown in FIG. 1, a typical blank EAPSM 10 is comprised of four layers. The first layer is a layer of quartz or other substantially transparent material 11, commonly referred to as a substrate. The next layer is typically an embedded phase shifting material ("PSM layer") 12, such as molybdenum silicide (MoSi), tantalum silicon nitride (TaSiN), titanium silicon nitride (TiSiN) or zirconium silicon oxide (ZrSiO) and other known phase materials. The next layer is typically an opaque material 13, such as chromium, which may optionally include an anti-reflective coating such as chromium oxynitride (CrON). The top layer is a photosensitive resist material 14.

The method for processing a conventional EAPSM is now described. The desired pattern of opaque material 13 to be created on the EAPSM 10 may typically be scanned by an electron beam (E-beam) or laser beam in a raster or vector fashion across the blank EAPSM 10. One such example of a raster scan exposure system is described in U.S. Pat. No. 3,900,737 to Collier. As the E-beam or laser beam is scanned across the blank EAPSM 10, the exposure system directs the E-beam or laser beam at addressable locations on the EAPSM. The areas of the photosensitive resist material that are exposed to the E-beam or laser beam become soluble while the unexposed portions remain insoluble.

As shown in FIG. 2, after the exposure system has scanned the desired image onto the photosensitive resist material 14, the soluble photosensitive resist material is removed by means well known in the art, and the unexposed, insoluble photosensitive resist material 14' remains adhered to the opaque material 13. Thus, the pattern to be formed on the EAPSM 10 is formed by the remaining photosensitive resist material 14'.

The pattern is then transferred from the remaining photoresist material 14' to the opaque layer 13 and PSM layer 12 via known etch processes, wherein the opaque layer 13 and PSM layer 12 is removed in regions which are not covered by the remaining photoresist 14'. There are a wide variety of etching processes known in the art, including dry etching as well as wet etching, and thus a wide variety of equipment used to perform such etching. After etching is completed, the remaining photoresist material 14' is stripped or removed and the EAPSM 10 is completed, as shown in FIG. 3. In the completed EAPSM 10, the pattern as previously reflected by the PSM 12' and opaque materials 13' is located in regions where the remaining photoresist 14' remain after the soluble materials were removed in prior steps.

In operation, EAPSMs permit some light from the exposure tools (e.g., semiconductor imaging tools such as wafer steppers) to be transmitted through the opaque layer. In other words, the opaque layer ("the lines") is partially transmissive. The light that passes through the phase shift layer is engineered to be 180° out of phase with light transmitted through the etched areas ("the space") in the mask. The phase-shifted electric field amplitude and the non-phase-shifted electric field amplitude destructively interfere with each other. As a result, the net amplitude of light becomes zero in the spaces. The zero amplitude node increases the image contrast and depth of focus. Put another way, the phase shift material enhances areas of transition for bright (e.g., transparent) to dark (e.g., opaque) materials, and thus, allows for more exposure latitude.

To determine if there are any unacceptable defects in a particular photomask, it is necessary to inspect the photomask. A defect is any flaw affecting the geometry of the pattern design. For example, a defect may result when chrome is located on portions of the EAPSM 10 where it should not be (e.g., chrome spots, chrome extensions, or chrome bridging between geometry) or unwanted clear areas (e.g., pin holes, clear extensions, or dear breaks). A defect in an EAPSM can cause a semiconductor to function improperly. To avoid improper function, a semiconductor manufacturer will typically indicate to a photomask manufacturer the size of defects that are unacceptable. All defects of the indicated size (and larger) must be repaired. If such defects cannot be repaired, the mask must be rejected and rewritten.

Typically, automated mask inspection systems, such as those manufactured by KLA-Tencor and ETEC (an Applied Materials company) are used to detect defects. Inspection tools use light transmitted through the EAPSM to find defects in a pattern. In this regard, automated inspection systems direct an illumination beam at the photomask and detect the intensity of the portion of the light beam transmitted through and reflected back from the photomask. The detected light intensity is then compared with expected light intensity, and any deviation is noted as a defect. In this regard, the inspection tool compares the patterned data on the mask to either another part of the mask or to expected pattern data stored in a database. The details of one inspection system can be found in U.S. Pat. No. 5,563,702, assigned to KLA-Tencor. Current inspection equipment is manufactured to operate at a wavelength of 365 nm. Examples of such inspection systems include the KLA-Tencor SLF 77 and AMAT ARIS21-I.

Current inspection tools, however, are often unable to detect defects in conventional EAPSMs. In this regard, phase shift materials used in conventional EAPSMs are deposited on the mask to have specific transmission and phase shift specifications at the exposure tool (e.g., wafer stepper) wavelength, which is currently 248 nm, 193 nm, and 157 nm depending upon the type of exposure tool used. Such current exposure tools require that the EAPSM layer transmit light at a rate of approximately 6–20% relative to the transmission of quartz. Accordingly, current phase shift materials in EAPSMs are tuned to be partially transmissive (e.g., 6–20% relative to quartz) at the exposure tool wavelengths, and thus, meet the optical requirements of exposure tools.

These same phase shift materials, by contrast, are highly transmissive at the greater, inspection tool wavelength (currently 365 nm), thereby making it difficult for inspection tools to detect defects in the EAPSM during inspection. In this regard, current inspection tools require that the phase shift material of the EAPSM transmit light during inspection at a rate of approximately 40–50% or less (depending on the type of inspection tool used) when compared to the transmission of light through the transparent regions (e.g., quartz) of the EAPSM. This is required so that the inspection tools can distinguish between light and dark areas on the EAPSM, thereby making defects apparent to the inspection tool. It should be noted that the particular optical specifications of the inspection tools vary depending upon the type of equipment used. For example, the KLA-Tencor 3XX Series requires a transmission of approximately 40% or less through the PSM layer when compared with quartz. Other inspection tools, such as the KLA-Tencor SLF Series, Lasertec MD2XXX and AMAT ARIS Series, by contrast, require a transmission of 50% or less through the PSM layer when compared with the transmission through quartz. Because, as noted herein, current phase shift materials are highly transmissive at the 365 nm inspection tool wavelength (typically greater than 50% when compared to quartz), the inspection tool cannot distinguish the phase shift material from the from quartz. Phrased another way, the inspection tool is unable to distinguish between light and dark areas in the mask. Thus, it has become increasingly difficult to obtain reliable and accurate inspection results. As a result, the reliability of inspection equipment has become increasingly marginal.

For example, tantalum silicon nitride (TaSiN) has been found to be a good choice of material as the PSM layer 12 for use at the 193 mm exposure tool wavelength. As shown in FIG. 4, TaSiN is substantially opaque at the 193 nm exposure tool wavelength, allowing a transmission of approximately 15% and a 180 degree phase shift. Thus, the TaSiN composite meets the optical specifications necessary for use with conventional exposure tools. TaSiN, however, is highly transmissive at the 365 nm inspection tool wavelength. Referring to FIG. 4, the TaSiN composite material allows approximately 80% transmission of light through the TaSiN PSM layer 12 at the 365 nm inspection tool wavelength, and thus, is substantially transparent during inspection. Because transmission here is outside the acceptable optical range required by current inspection tools (e.g., 40–50% or less), the inspection tool cannot adequately distinguish the TaSiN PSM layer 12 from the quartz layer. As a result, defects in the photomask are not detected, and thus, the semiconductor from which the mask will be made (once the mask is etched or processed) may have imperfections. Accordingly, reliable inspection results cannot be obtained.

After inspection is completed (albeit with unsatisfactory results), a completed photomask is cleaned of contaminants. The cleansing process can also affect the quality of the photomask. Next, a pellicle may be applied to the completed EAPSM to protect its critical pattern region from airborne contamination. Subsequent through pellicle defect inspection may be performed. Sometimes, either before or after a pellicle is applied, the EAPSM may be cut. After these steps are completed, the completed EAPSM is used to manufacture semiconductors and other products.

Semiconductor manufacturers typically use EAPSMs to transfer micro-scale images defining a semiconductor circuit onto a silicon or gallium arsenide substrate or wafer. The process of transferring an image from a EAPSM to a silicon substrate or wafer is commonly referred to as "lithography" or "microlithography". Typically, as shown in FIG. 5, the semiconductor manufacturing process comprises the steps of deposition, photolithography, and etching. During deposition, a layer of either electrically insulating or electrically conductive material (like a metal, polysilicon or oxide) is deposited on the surface of a silicon wafer. This material is then coated with a photosensitive resist material. The EAPSM is then used much the same way a photographic negative is used to make a photograph. Photolithography involves projecting the image on the EAPSM onto the wafer. Often, the image on the photomask is projected several times side by side onto the wafer. This process is known as "stepping", with the EAPSM typically referred to as a "reticle".

As shown in FIG. 6, to create an image on a semiconductor wafer 20, an EAPSM 10 is interposed between the semiconductor wafer 20, which includes a layer of photosensitive material, and an optical system 22. An energy source, commonly referred to as a wafer stepper 23, is used to transfer an image onto a semiconductor wafer. The energy generated by the wafer stepper 23 is inhibited from passing through the areas of the photomask 10 where the opaque material is present and partially inhibited from passing through the areas of the photomask 10 where the PSM layer is present. By contrast, energy from the wafer stepper 23 passes through the transparent portions of the quartz substrate not covered by the opaque and PSM layers. Current wafer stepper tools are configured to operate at various exposure tool wavelengths (e.g., 248 nm, 193 nm and 157 nm) which are significantly lower than the 365 nm wavelength at which current inspection tools operate.

The optical system 22 projects a scaled image of the pattern of the mask onto the semiconductor wafer 20 and causes a reaction in the photosensitive material on the semiconductor wafer. The solubility of the photosensitive material is changed in areas exposed to the energy. In the case of a positive photolithographic process, the exposed photosensitive material becomes soluble and can be removed. In the case of a negative photolithographic process, the exposed photosensitive material becomes insoluble and unexposed soluble photosensitive material is removed.

After the soluble photosensitive material is removed, the image or pattern formed in the insoluble photosensitive material is transferred to the substrate by a process well known in the art which is commonly referred to as etching. Once the pattern is etched onto the substrate material, the remaining resist is removed resulting in a finished product. A new layer of material and resist may then be deposited on the wafer and the image on the next photomask is projected onto it. Again the wafer is developed and etched. This process is repeated until the circuit is complete.

In the field of semiconductor design, circuit densities on semiconductor wafers have continued to increase while at the same time the minimum feature size on semiconductor wafers have continued to decrease. Manufacturers of optical lithography tools (e.g., wafer steppers) have recognized that the current state of semiconductors design has entered into a sub-wavelength regime and is approaching its resolution limits. In this regard, because optical steppers are now being used for deep, sub-wavelength designs, such manufacturers have developed new technology and equipment to meet these design changes. More specifically, the wafer steppers have been designed in accordance with the transmission properties of current EAPSMs. Inspection tool manufacturers lag behind the wafer stepper manufacturers and have not modified their inspection equipment to meet the optical properties of current EAPSMs. Thus, current phase shift materials meet the optical requirements of exposure tool wavelength (e.g. 193 nm, 157 nm and 247 nm), on the one hand, but do not meet the optical requirements of inspection tool wavelength (e.g., 365 nm), on the other hand. Thus, there has been a long felt need to develop a mask that will meet the optical requirements of both exposure and inspection tools.

Other prior art discloses methods for improving the overall inspection of photomasks, however, this prior art does not address the particular need to make defects in current EAPSMs inspectible in the first instance. For example, U.S. Pat. No. 6,110,623 to O'Grady et al. ("the O'Grady Patent") addresses the problem where a photomask defect is too small for defect detection by inspection tools. The O'Grady Patent discloses that defect detection during inspection can be improved by depositing a contrast enhancing thin film on the top surface of a finished photomask to alter the finished photomask's reflectivity. In this regard, the top surface of a finished photomask (e.g., one that has already been etched and patterned) is coated with a contrast-enhancing layer to improve the visibility of any defects that exist on the photomask. In other words, the contrast enhancing layer disclosed in the O'Grady Patent is used to make defects appear larger so that they can be more easily seen (assuming that the primary features are inspectible in the first place).

Although useful in improving the inspection of photomasks, this method has some significant drawbacks in its operation and results. In particular, demands for faster production time between the moment a photomask order is placed to the ultimate delivery of the finished photomask make it desirable to reduce the total amount of time spent processing a blank photomask into a finished photomask. Because this enhancement layer is not deposited until after the photomask is processed, the total processing time spent making the photomask is increased. As a result, the overall productivity of a photomask production facility is decreased. Additionally, by depositing the contrast enhancing layer to the photomask after it has been processed, there is an added risk that the photomask will incur additional defects during the deposition of such layer on the photomask. Further, the O'Grady Patent does not address the problem associated with inspection equipment as discussed herein. Specifically, the O'Grady Patent does not disclose the selection of materials for the contrast enhancing layer which will decrease the transmission of light through the PSM layer of an EAPSM to approximately 40–50% or less when compared with transmission through the quartz region of the EAPSM, as required by current inspection tools. Thus, although useful in enhancing the size of defects during inspection, such defects may not be detected in the first instance using the mask of the O'Grady Patent. Accordingly, poor inspection results are still obtained using the photomask of the O'Grady Patent.

Others have attempted to address the problems associated with the prior art by adjusting the material of choice for the PSM layer in a blank photomask. For example, U.S. Pat. No. 5,935,735 and Japanese Pat. Nos. JP 08-304998A and JP 2000-10255 to Toppan (collectively, "the Toppan Patents") disclose the use of a half-tone zirconium based compound as the choice material for a PSM layer in a "half-tone type phase shift mask". The Toppan Patents disclose that the zirconium based PSM layer decreases transmission of light at the exposure tool wavelength and inspection tool wavelength. However, the Toppan Patents do not address the problem of obtaining reliable inspection results for EAPSMs (e.g., MoSi based materials) which are more typically used in the semiconductor industry. In this regard, zirconium-based half tone masks are rarely used since as zirconium has been found to exhibit poor etching properties. Thus, the teachings of the Toppan Patents are limited to zirconium-based half tone masks and do not address the problems associated with inspecting EAPSMs more commonly used in the semiconductor industry.

While the prior art is of interest, the known methods and apparatus of the prior art present several limitations which the present invention seeks to overcome.

In particular, it is an object of the present invention to provide an EAPSM having at least one intermediate inspection layer made from materials which improve the inspection results of the mask, while maintaining a sufficiently low transmission at the exposure tool wavelength.

It is another object of the present invention to provide a method and apparatus for improving inspection results of an EAPSM by decreasing the transmission of light at the inspection tool wavelength while maintaining the transmission of light at the exposure tool wavelength.

It is another object of the present invention to solve the shortcomings of the prior art.

Other objects will become apparent from the foregoing description.

SUMMARY OF THE INVENTION

It has now been found that the above and related objects of the present invention are obtained in the form of a method and apparatus for improving the inspection of photomasks, and more particularly, EAPSMs, by interposing onto one or more intermediate layers above and/or below the PSM layer in a conventional EAPSM. More particularly, the intermediate layer(s) is (are) made from materials which has (have) properties that provide for additional attenuation (e.g., decrease transmission) of the EAPSM layer at the inspection tool wavelength (e.g., 365 nm) while at the same time provide for sufficiently low transmission of light at the exposure tool wavelength (e.g., 248 nm, 193 nm or 157 nm).

More particularly, the present invention is directed to a blank or processed photomask which includes: a photoresist layer forming a top layer of the blank (or processed) photomask; a substantially transparent layer forming a bottom layer of the blank (or processed) photomask; an opaque layer between the top and bottom layers of the blank (or processed) photomask; a phase shift layer between the opaque and bottom layers of the blank (or processed) photomask; and at least one intermediate layer between the opaque and substantially transparent layers, wherein said at least one intermediate layer is made from materials having a higher extinction coefficient at an inspection tool wavelength than at an exposure tool wavelength. In the preferred embodiments of the present invention, the intermediate layer(s) is (are) made from metal-based materials, including, but not limited to NiFe, Ir, Rh, Pd, Pt, Al, Cr, Ti, Au, V, Co, Ni, Fe, Cu, Ta, Mo, WN, TaSi, a-Si, TiSi, MoN and Nb.

Further, the phase shift layer(s) should preferably have a thickness ranging from approximately 500 Å–1000 Å and said at least one intermediate layer has a thickness of approximately 50 Å–150 Å. Further, in various embodiments of the blank (or processed) photomask of the present invention: the substantially transparent layer may be made from quartz; the phase shift material may be made from MoSi, TaSiN, TiSiN and ZrSiO; and the opaque layer may be made from chrome.

More particularly, the photomask of the present invention can be arranged in a variety of different manners. For example, in one embodiment, the blank photomask of the present invention includes: an intermediate layer above the transparent layer; a phase shift layer above the intermediate layer; an opaque layer above the phase shift layer; and a photoresist layer a above the opaque layer. In another embodiment, the blank photomask of the present invention includes: a phase shift layer above the transparent layer; an intermediate layer above the phase shift layer; an opaque layer above the intermediate layer; and a photoresist layer above the opaque layer. In yet another embodiment, the blank photomaks of the present invention includes: a first intermediate layer above the transparent layer; a phase shift layer above the first intermediate layer; a second intermediate layer above the phase shift layer (e.g., the phase shift layer is between the first and second intermediate layers); an opaque layer above the second intermediate layer; and a photoresist layer above the opaque layer.

Unlike the prior art, the present invention teaches the deposition of one or more thin films during the manufacture of the photomask blank to ensure that the entire film stack is visible at a key inspection wavelength. These thin film(s) are made from materials which improve the inspectibility of all features on the photomask before they are even patterned.

BRIEF DESCRIPTION OF THE DRAWINGS

The above and related objects, features and advantages of the present invention will be more fully understood by reference to the following, detailed description of the preferred, albeit illustrative, embodiment of the present invention when taken in conjunction with the accompanying figures, wherein.

DETAILED DESCRIPTION OF THE INVENTION

The present invention relates to a method and apparatus for improving the inspection of EAPSMs by interposing one or more intermediate layers in a conventional EAPSM, wherein the intermediate layer(s) is (are) made from materials which have properties that provide for additional attenuation (e.g., decrease transmission) of the mask at the inspection tool wavelength (e.g., 365 nm) while at the same time maintain a low transmission of light at the exposure tool wavelength (e.g., 248 nm, 193 nm or 157 nm). Thus, by using EAPSMs (whether blank or processed) having the intermediate layer(s) of the present invention, accurate results can be obtained in both the process for writing an image onto a semiconductor wafer and the process for inspecting the EAPSM.

More particularly, in the preferred embodiment of the method and apparatus of the present invention, one or more intermediate layers are interposed in a blank EAPSM during the manufacture of such mask blanks. As explained below, the intermediate layer(s) should have a higher extinction coefficient (e.g., absorptivity of light) at the 365 nm inspection tool wavelength than at the various exposure tool wavelengths (i.e., 157 nm, 193 nm and 248 nm). More particularly, such materials should have an extinction coefficient which will absorb a sufficient amount of light to reduce the transmission of light through the PSM layer to 40–50% or less relative to quartz at the 365 nm inspection tool wavelength. Further, the extinction coefficient for these materials at the lower exposure tool wavelengths (e.g., 193 nm, 157 nm and 247 nm) should be sufficiently low so as permit a sufficient amount of light to be transmitted (e.g., 6–20%) through the mask.

Additionally, the intermediate layer(s) should be relatively thin when compared to the thickness of the PSM layer. This is to ensure that the intermediate layer(s) does not absorb too much light so as to alter the optical properties of the mask in such a manner that the mask will be unable to meet the optical requirements of both inspection and exposure tools. More particularly, the PSM layer of an EAPSM typically has a thickness ranging from approximately 500 Å–1000 Å. For the purposes of the present invention, the intermediate layer(s) should have a thickness ranging from approximately 50 Å–150 Å. By choosing materials with these properties (e.g., a suitable absorptivity and thickness), accurate and reliable results can be obtained during both the inspection and exposure processes.

Figure 1:
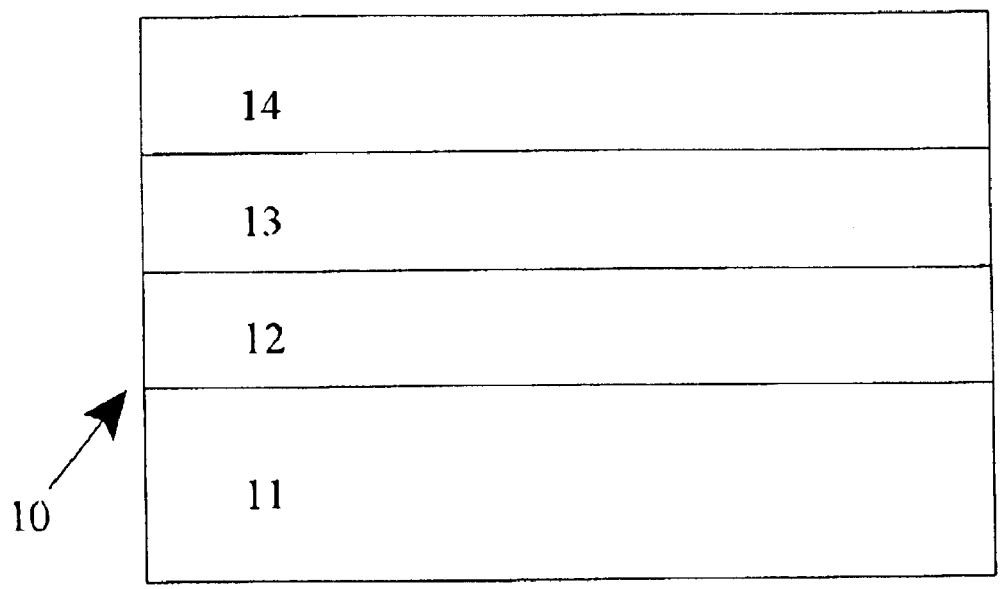
FIG. 1 represents a blank or undeveloped EAPSM of the prior art.
Figure 2:
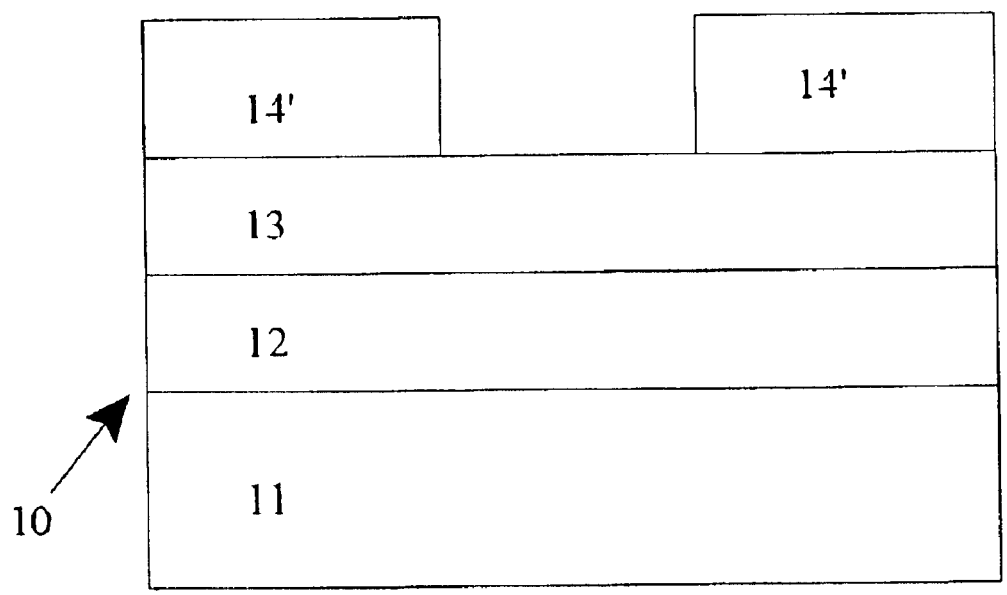
FIG. 2 represents the EAPSM of FIG. 1 after it has been partially processed.
Figure 3:
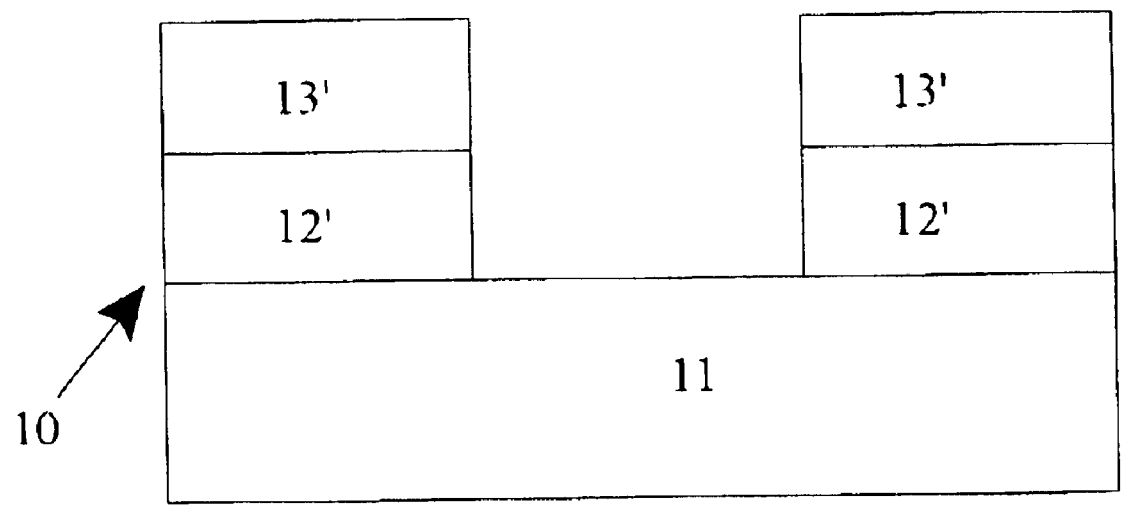
FIG. 3 represents the EAPSM of FIGS. 1 and 2 after it has been fully processed.
Figure 4:
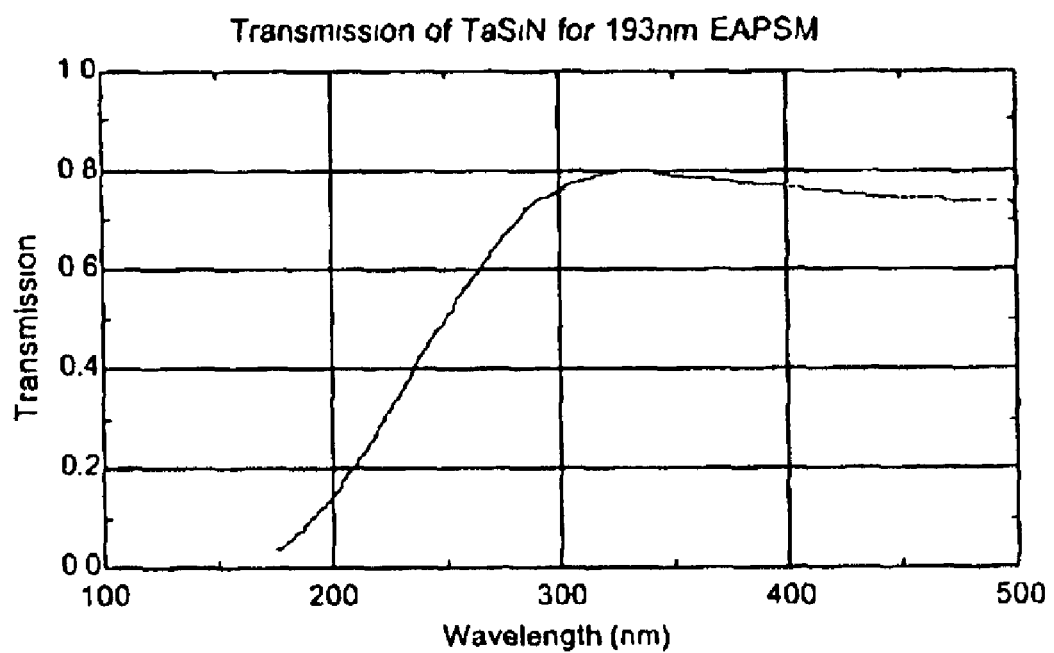
FIG. 4 is a graph showing the transmission of light through a TaSiN PSM layer of a conventional EAPSM at various wavelengths, wherein the EAPSM has been tuned for 193 nm exposure tools.
Figure 5:
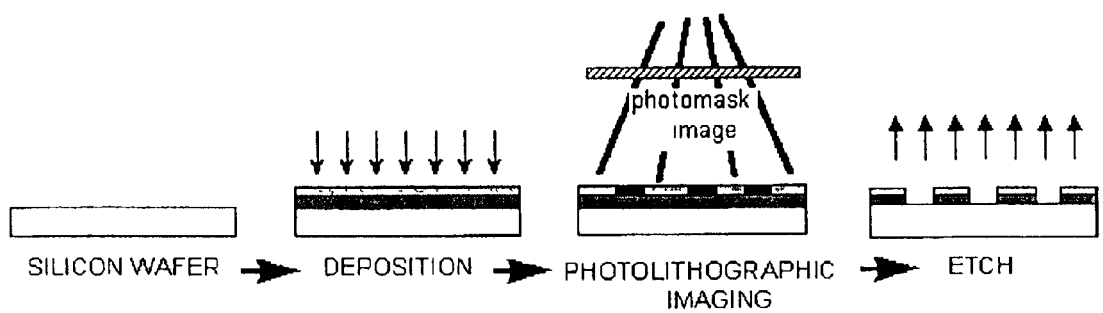
FIG. 5 is a flowchart showing the method of using a processed photomask to make or process a semiconductor wafer.
Figure 6:
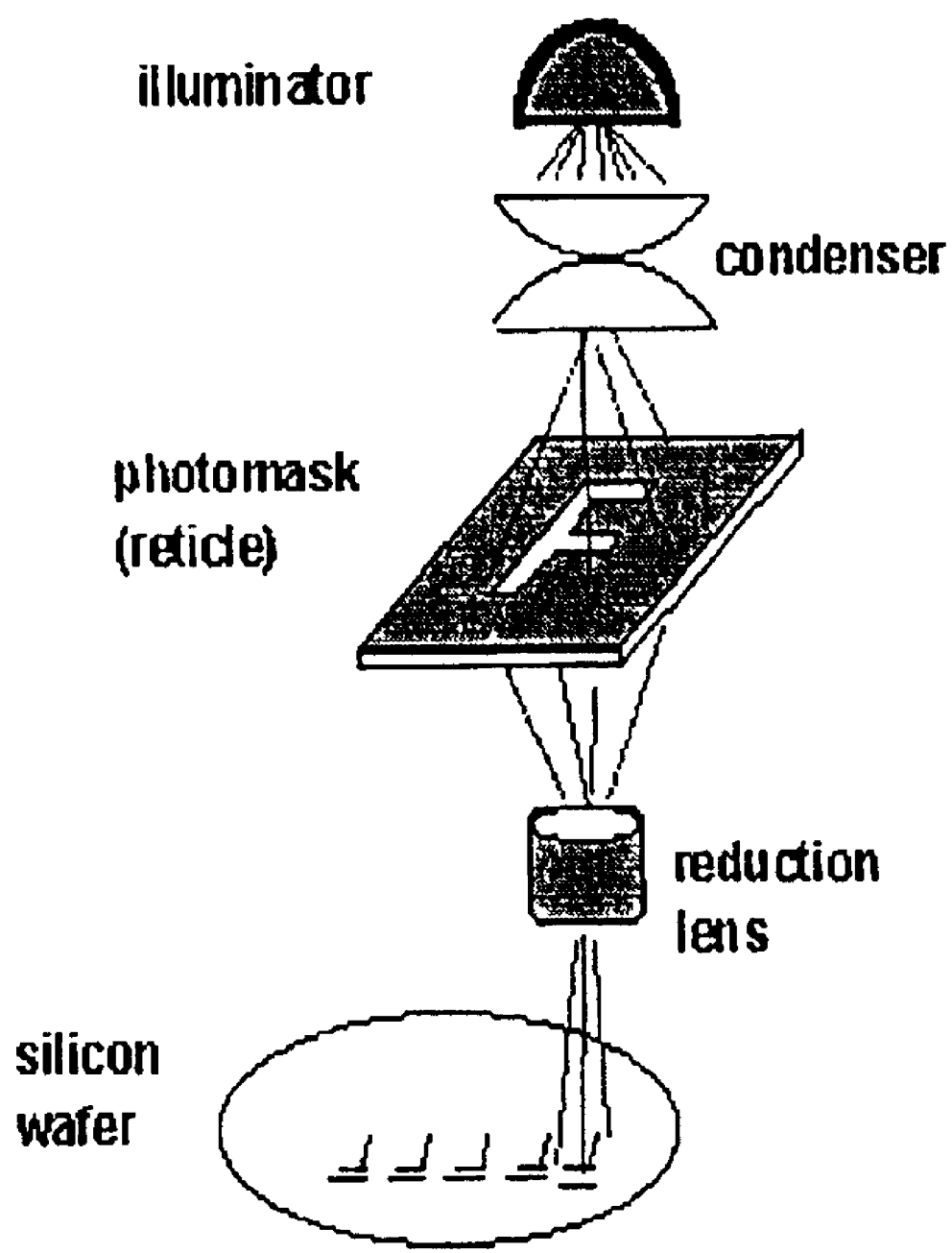
FIG. 6 shows the process of making a semiconductor using a wafer stepper.
Figure 7A:
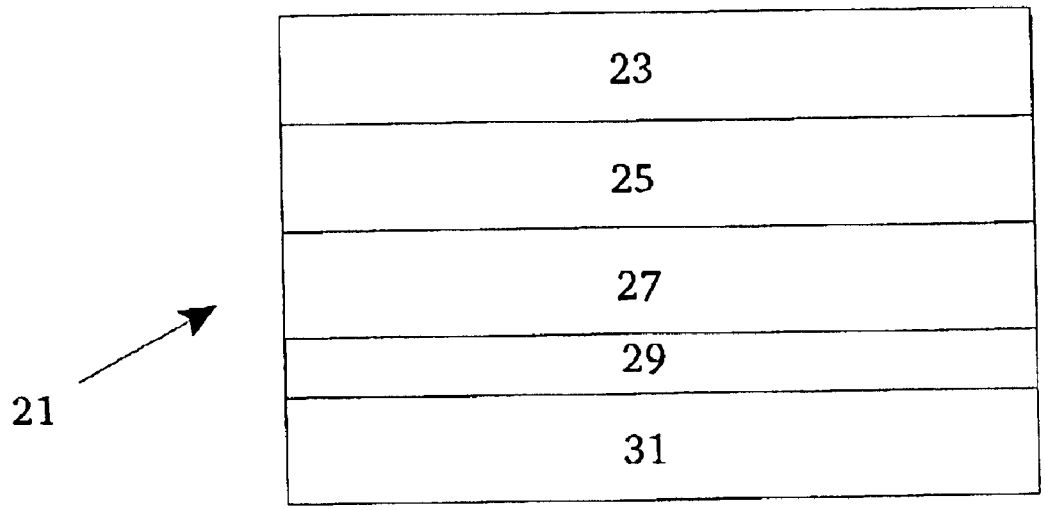
FIG. 7A represents one embodiment of the mask of the present invention wherein an intermediate layer is deposited beneath the PSM layer of an EAPSM.
Figure 7B:
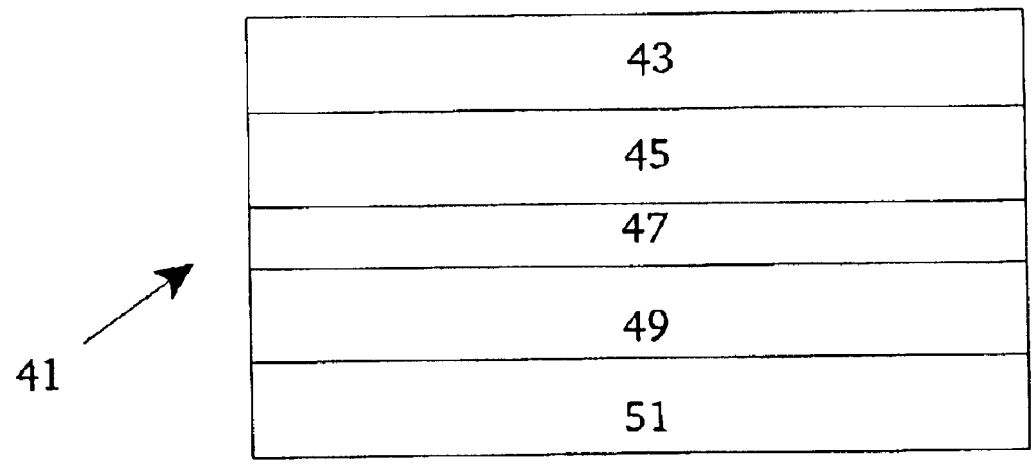
FIG. 7B represents a second embodiment of the mask of the present invention wherein an intermediate layer is deposited above the PSM layer of an EAPSM.
Figure 7C:
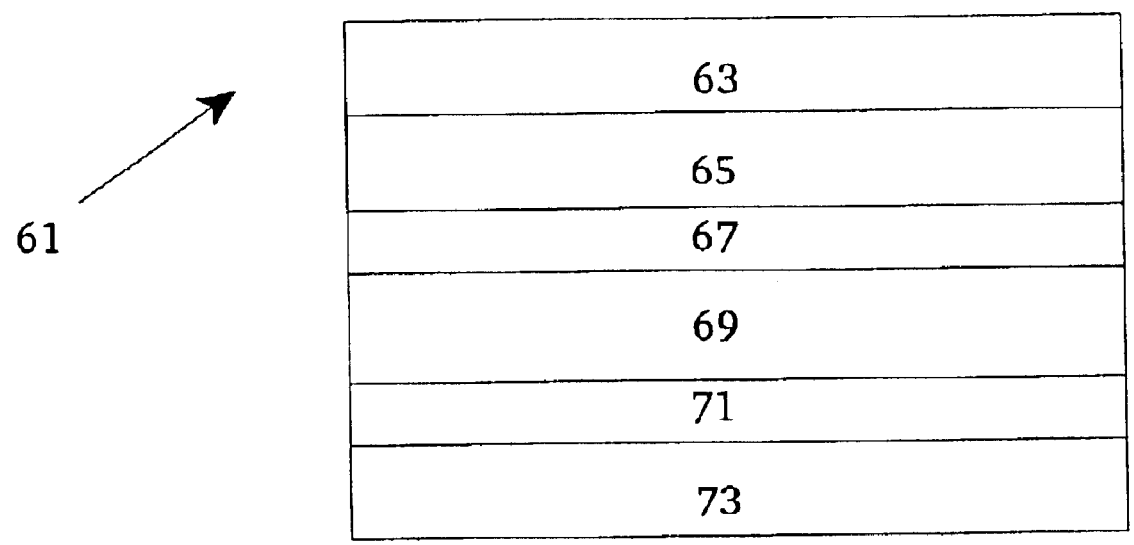
FIG. 7C represents a third embodiment of the mask of the present invention wherein intermediate layers are deposited both above and below the PSM layer of an EAPSM.

Referring to FIGS. 7A–7C, a blank EAPSM having conventional layers (e.g., a substantially transparent layer, PSM layer, opaque layer and photoresist layer) is formed to have an additional intermediate layer(s) deposited either above, below or both above and below the PSM layer in the EAPSM. The additional intermediate layer(s) is deposited during the manufacture of the EAPSM blank. It should be noted that the present invention is not limited to the particular arrangement shown in these figures, as other layers may also be appropriately incorporated into the EAPSM for other known or hereinafter developed purposes.

In a preferred embodiment, the intermediate layer is deposited below the PSM layer of the EAPSM 21, as shown in FIG. 7A. By this arrangement, any reflection off of the intermediate layer will not interfere with the optical properties of the PSM layer. More particularly, an intermediate layer 29 is deposited above a substantially transparent layer 31, a PSM layer 27 is deposited above the intermediate layer 29, an opaque layer 25 (e.g., chromium) is deposited above the PSM layer 27 and a photoresist layer 23 is deposited above the opaque layer 25.

In another embodiment, the intermediate layer is deposited above the PSM layer of the EAPSM 41, as shown in FIG. 7B. More particularly, a PSM layer 49 is deposited above a substantially transparent layer 51, an intermediate layer 47 is deposited above the PSM layer 49, an opaque layer 45 (e.g., chromium) is deposited above the intermediate layer 47 and a photoresist layer 43 is deposited above the opaque layer 45.

In another embodiment, two intermediate layers are included in the mask, wherein an intermediate layer is deposited above and below the PSM layer of EAPSM 61, as shown in FIG. 7C. More particularly, a first intermediate layer 71 is deposited above a substantially transparent layer 73, a PSM layer 69 is deposited above the first intermediate layer 71, a second intermediate layer 67 is deposited above the phase layer 69, an opaque layer 65 (e.g., chromium) is deposited above the second intermediate layer 67 and a photoresist layer 63 is deposited above the opaque layer 65.

Metal-based materials are a good choice of material for the intermediate layer(s) implemented in the present invention. This is because metals typically have a greater extinction coefficient k at the 365 nm inspection tool wavelength than at the various exposure tool wavelengths (e.g., 157 nm, 193 nm and 248 nm). In this regard, metal-based materials, when used as an intermediate layer in an EAPSM, absorb a sufficient amount of light at the 365 nm inspection wavelength such that the transmission of light that passes through the PSM layer during inspection is reduced to approximately 40–50% or less when compared with the transmission of light through the substantially transparent (e.g., quartz) layer, as required by current inspection tools. As a result, the entire film stack in the mask is visible at the key inspection wavelength, and thus, defects in the EAPSM can be detected and corrected. It has also been found that the use of metal-base materials as the intermediate layer(s) of the present invention absorbs less light at the exposure tool wavelength than at the inspection tool wavelength. Thus, although the intermediate layer may alter the transmission of light at the exposure tool wavelength, this change in transmission is insignificant. In other words, the transmission of light at the exposure tool wavelength still meets the optical requirements of the exposure tool even with the addition of a metal-based intermediate layer(s). Thus, by using a metal-based intermediate layer(s) in conventional EAPSMs, as shown in FIGS. 7A–7C, respectively, the mask of the present invention meets the optical requirements of both exposure and inspection tools.

More specifically, the metal-based materials from which the intermediate layers can be made include, but are not necessarily limited to, NiFe, Te, Ir, Rh, Pd, Pt, Al, Cr, Au, V, Cu, Ta, Mo, WN, TaSi, a-Si, TiSi, MoN and Nb. The following chart ("Table 1") lists the index of refraction n and the extinction coefficient k for each of the these materials at the respective 193 nm exposure tool and 365 inspection tool wavelengths. Further, Table 1 shows the "k ratio" for each of these materials, which is calculated as follows: k ratio= k@365 nm÷k@193 nm). To achieve the objects of the present invention, the index of refraction n and extinction coefficient k for each of the listed materials should both be higher for the selected material at the 365 nm inspection wavelength than at the 193 nm wavelength. Further, materials having higher k ratios typically produce better optical results during inspection than those materials having lower k ratios. In particular, the best materials from the perspective of the EAPSM's optical qualities are preferably those which have a k ratio of approximately 1.8 or greater. Thus, for example, aluminum (k ratio=1.9985) exhibits better optical results than Nb (k ratio=1.0566). It should be noted, however, that in selecting a material for the inspection layer, other factors should also be considered, including, for example, the material's: etching properties; chemical stability; resistance to cleaning chemistries; cost; availability; etc. Thus, for example, although NiFe (k ratio=2.9191) has a higher k ratio than aluminum (k ratio=1.9986) and chromium (k ratio=1.9667) and titanium (k ratio=1.8165), aluminum, chromium and titanium may nevertheless be better choices of material for the intermediate layer(s) since they have been shown to exhibit excellent etching properties, chemical stability, etc. Additionally, amorphous silicon has also been found to be a good material choice even though its k ratio (e.g., k ratio=1.2599) is less than 1.8. Thus, in a preferred embodiment, the intermediate layer(s) is made from either aluminum, chromium, titanium or amorphous silicon. With the foregoing in mind, the following chart lists a variety of materials which could be used as the intermediate layer of the present invention.

TABLE 1

| | 193 nm | | 365 nm | | |
|---|---|---|---|---|---|
| Material | n | k | n | k | k ratio |
| NiFe | 0.88235 | 0.91037 | 1.3814 | 2.5664 | 2.8191 |
| Te | 1.747 | 1.3634 | 1.7818 | 3.5746 | 2.6218 |
| Ir | 0.69743 | 1.3791 | 1.53 | 3.0501 | 2.2117 |
| Rh | 0.70105 | 1.772 | 1.1099 | 3.8404 | 2.1673 |
| Pd | 0.72992 | 1.2903 | 1.2378 | 2.7191 | 2.1073 |
| Pt | 1.4194 | 1.293 | 1.6204 | 2.6201 | 2.0264 |
| Al | 0.1135 | 2.2165 | 0.40701 | 4.4296 | 1.9985 |
| Cr | 0.84921 | 1.6551 | 0.4005 | 3.2551 | 1.9667 |
| Ti | 1.0782 | 1.1337 | 1.37 | 2.0594 | 1.8165 |
| Au | 1.3938 | 1.1994 | 1.716 | 1.862 | 1.5524 |
| V | 1.1407 | 2.1053 | 2.1801 | 3.26 | 1.5485 |

TABLE 1-continued

| Material | 193 nm | | 365 nm | | k ratio |
|---|---|---|---|---|---|
| | n | k | n | k | |
| Co | 1.2914 | 1.7729 | 1.5052 | 2.6926 | 1.5188 |
| Ni | 1.0087 | 1.4621 | 1.62 | 2.1702 | 1.4843 |
| Fe | 1.2636 | 1.6937 | 1.7504 | 2.4787 | 1.4635 |
| Cu | 0.96944 | 1.4135 | 1.2695 | 1.9518 | 1.3808 |
| Ta | 1.5686 | 1.7523 | 1.8999 | 2.3892 | 1.3635 |
| Mo | 0.78945 | 2.3634 | 3.0601 | 3.1904 | 1.3499 |
| WN | 1.6733 | 1.7752 | 2.04345 | 2.3338 | 1.3147 |
| TaSi | 1.1039 | 1.5073 | 2.5428 | 1.9066 | 1.2649 |
| a-Si | 0.983 | 2.1111 | 3.8986 | 2.6597 | 1.2599 |
| TiSi | 0.95198 | 2.132 | 2.2901 | 2.5282 | 1.1858 |
| MoN | 1.5259 | 1.3732 | 2.2128 | 1.5933 | 1.1603 |
| Nb | 1.3112 | 2.2529 | 2.4595 | 2.3805 | 1.0566 |

An important aspect of the mask of the present invention is flexibility in the choice of materials for the intermediate layer(s). In this regard, the choice of material for the intermediate layer can be varied to meet the optical specifications of different types of exposure tools (e.g., 193 nm, 157 nm, 13 nm and 248 nm) as well as both current (e.g., 365 nm) and newly developed inspection tools. Thus, the present invention is not limited to the use of the metals listed in Table 1 as the material of choice for the intermediate layer. Rather, other materials and metals having a greater extinction coefficient at the inspection tool wavelength than at the exposure tool wavelength may also be used as the intermediate layer provided that such materials absorb a sufficient amount of light to reduce the transmission of light through the PSM layer to approximately 40–50% or less (depending upon the inspection tool intended to be used) when compared with transmission through the quartz or substantially transparent layer. Of course, the inspection results may vary according to the choice of material for the intermediate layer and the choice of inspection equipment and the properties of a particular mask desired to be optimized.

The following describes several different embodiments of the present invention, wherein the EAPSM of each embodiment has been tuned for use with a 193 nm exposure tool. It should be noted, however, that the following embodiments are merely illustrative of the present invention and are not intended in any way to limit the present invention to these embodiments.

Figure 8:
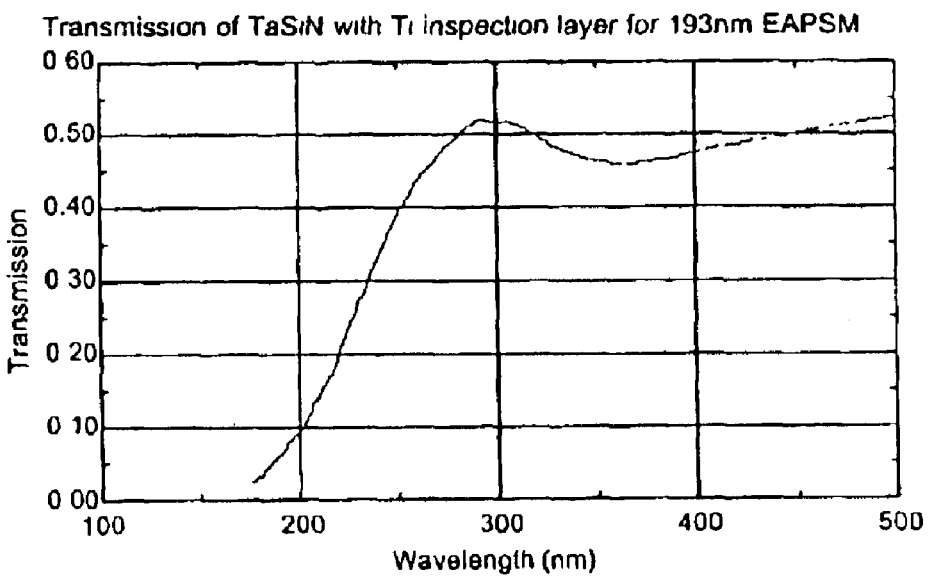
FIG. 8 is a graph showing the transmission of light, at various wavelengths, through a TaSiN PSM layer of the mask of FIG. 7A, wherein the mask includes a titanium intermediate layer deposited on the transparent layer and the mask has been tuned for use with 193 nm exposure tools.

In one embodiment, a titanium intermediate layer having a thickness of 75 Å is deposited beneath a TaSiN PSM layer having a thickness of 682 Å. More particularly, referring to FIG. 7A, the EAPSM 21 of this embodiment includes quartz as the transparent layer 31, titanium as the intermediate layer 29, TaSiN as the PSM layer 27, chromium as the opaque layer 25 and a photoresist layer 23. As noted in the Table 1, titanium has a higher extinction coefficient at the 365 nm inspection tool wavelength than at 193 nm exposure tool wavelength. Thus, as shown in FIG. 8, the addition of the titanium intermediate layer 29 to a conventional EAPSM having a TaSiN PSM layer 27 decreases the transmission at the longer, 365 nm inspection tool wavelength to approximately 47% while minimally decreasing the transmission at the shorter, 193 nm exposure tool wavelength to approximately 9%. As a result, the titanium intermediate layer 29 enables the EAPSM 21 to meet the optical specifications of both inspection tools (e.g., tools which permit for 50% or less transmission relative to quartz) and exposure tools.

Figure 9:
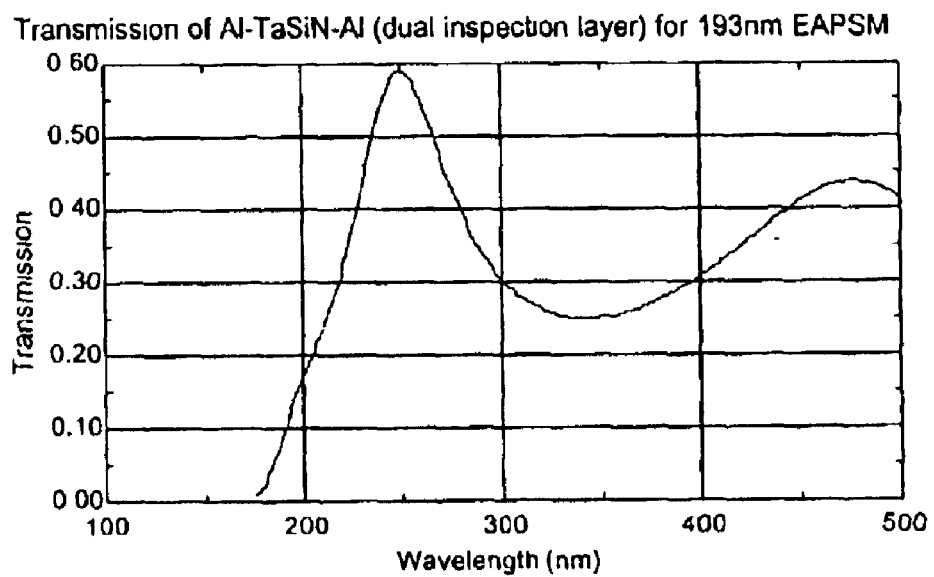
FIG. 9 is a graph showing the transmission of light, at various wavelengths, through a TaSiN PSM layer of the mask of FIG. 7C, wherein the mask includes aluminum intermediate layers above and below the PSM layer and the mask has been tuned for use with 193 nm exposure tools.

In another embodiment, highly reflective intermediate layers are applied both above and below a TaSiN PSM layer. More particularly, referring to FIG. 7C, the EAPSM 61 of this embodiment includes quartz as the substantially transparent layer 73, aluminum as the first intermediate layer 71 having a thickness of 50 Å, TaSiN as the PSM layer 69 having a thickness of 831 Å, aluminum as the second intermediate layer 67 having a thickness of 50 Å, chromium as the opaque layer 65 and a photoresist layer 63. This configuration creates a Fabry-Perot Etalon effect, thus, causing nodes of constructive and destructive interference. In other words, the second intermediate layer 67 interferes with reflection on the first intermediate layer 71, thereby eliminating the transmission of light altogether. As a result, in this embodiment, the first 71 and second 67 intermediate layers act as an EAPSM at the exposure wavelength and provides an interference transmission minima at the inspection wavelength. Referring to FIG. 9, an EAPSM having Al—TaSiN—Al film stack provides for approximately 8% transmission and a 180 degree phase shift at the 193 nm exposure tool wavelength and approximately 24% transmission at the 365 nm inspection tool wavelength. Thus, this configuration meets the optical specifications of both inspection tools and exposure tools.

Figure 10:
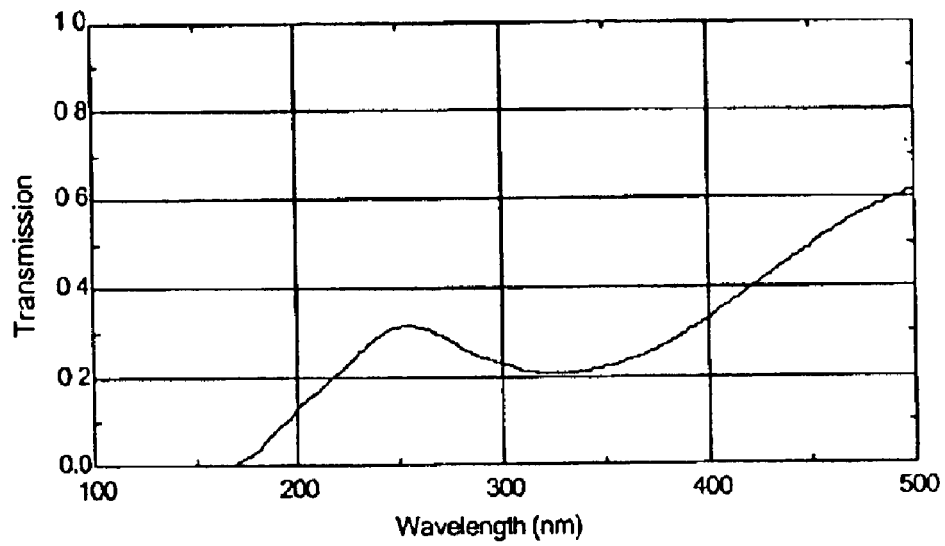
FIG. 10 is a graph showing the transmission of light, at various wavelengths, through a silicon nitride PSM layer of the mask of FIG. 7A, wherein the mask includes an amorphous silicon intermediate layer deposited on the transparent layer, and the mask has been tuned for use with 193 nm exposure tools.

In another embodiment, the EAPSM includes a silicon nitride (e.g., $Si_3N_4$) PSM layer having a thickness of 785 Å which is deposited above an amorphous silicon intermediate layer having a thickness of 50 Å. Referring to FIG. 7A, in this embodiment, the EAPSM 21 includes quartz as the transparent layer 31, amorphous silicon as the intermediate layer 29, silicon nitride as the PSM layer 27, chromium as the opaque layer 25 and a photoresist layer 23. As shown in FIG. 10, the PSM layer transmits light at an approximate rate of 15% relative to the quartz layer at the 193 nm exposure tool wavelength and transmits approximately 25% relative to the quartz layer at the 365 nm inspection tool wavelength. Thus, the EAPSM 21 meets the optical specifications of both the inspection and exposure tools.

Figure 11:
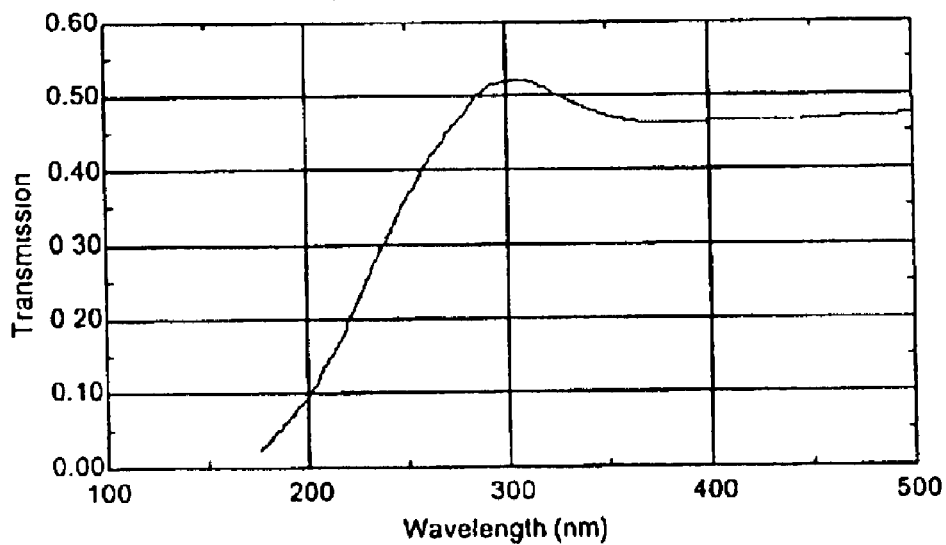
FIG. 11 is a graph showing the transmission of light, at various wavelengths, through a TaSiN PSM layer of the mask of FIG. 7B, wherein the mask includes a titanium intermediate layer deposited on a TaSiN PSM layer and the mask has been turned for use with 193 nm exposure tools.

In yet another embodiment, a titanium intermediate layer having a thickness of 75 Å is deposited above a TaSiN PSM layer having a thickness of 682 Å(i.e., on the transparent layer), as shown in FIG. 7B. More particularly, the EAPSM 41 of this embodiment includes quartz as the transparent layer 51, TaSiN as the PSM layer 49, titanium as the intermediate layer 47, chromium as the opaque layer 45 and a photoresist layer 43. As noted in the chart above, titanium has a higher extinction coefficient at the 365 nm inspection tool wavelength than at 193 nm exposure tool wavelength. Thus, as shown in FIG. 11, the addition of the titanium intermediate layer 47 to a conventional EAPSM having a TaSiN PSM layer 49 decreases the transmission at the longer, inspection wavelength to approximately 47% while minimally decreasing the transmission at the shorter, exposure tool wavelength to approximately 9%. As a result, the titanium intermediate layer enables the EAPSM to meet the optical specifications of both inspection tools (e.g., tools which permit for 50% or less transmission relative to quartz) and exposure tools. Thus, the EAPSM of this embodiment meets the optical specifications of both inspection and exposure tools.

EXAMPLE

Figure 12:
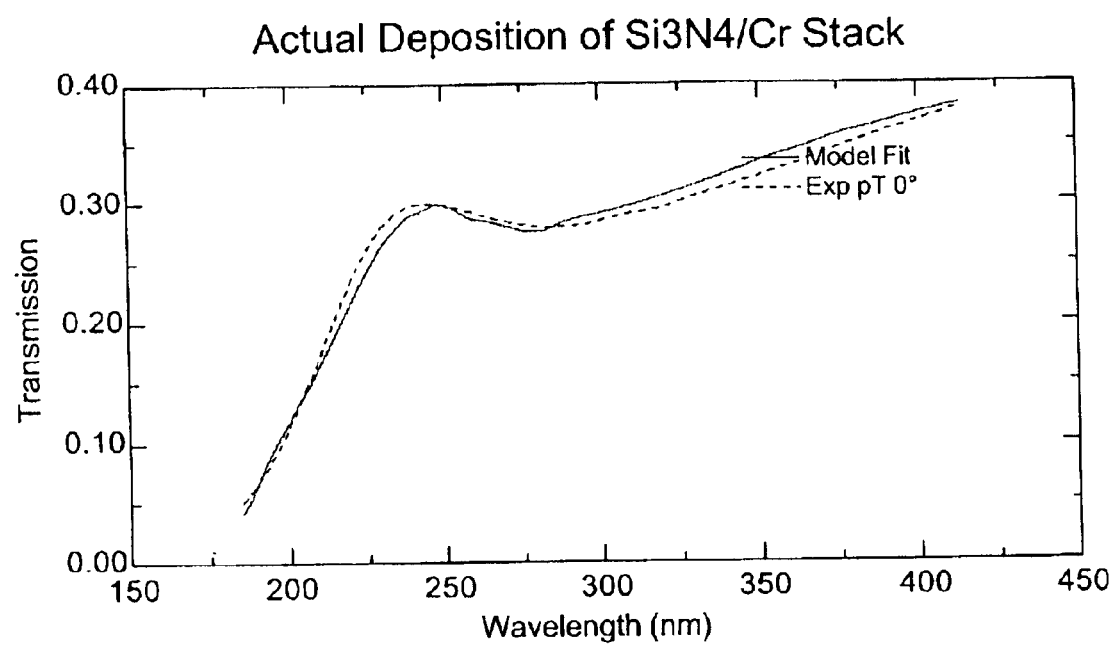
FIG. 12 is a graph showing the transmission of light, at various wavelengths, through a $Si_3N_4$ PSM layer of the mask of FIG. 7A, wherein the mask includes a chromium nitride intermediate layer deposited beneath the $Si_3N_4$ layer and the mask has been tuned for use with 193 mm exposure tools.

An EAPSM was made to have a chromium intermediate layer deposited beneath a silicon nitride PSM layer. More particularly and as shown in FIG. 7A, the EAPSM 21 includes quartz as the transparent layer 31, non-stoichiometric chromium nitride as the intermediate layer 29 having a thickness of 115 Å, silicon nitride (e.g., $Si_3N_4$) as the PSM layer 27 having a thickness of 674 Å, chromium as the opaque layer 25 and a photoresist layer 23. The silicon nitride PSM layer 27 was tuned for 193 nm exposure tools and 365 nm inspection tools. Referring to FIG. 12, it was found that the EAPSM 21 transmitted light at a rate of 9% with a 180 degree phase shift at the 193 nm exposure tool wavelength. At the 365 nm inspection tool wavelength, the EAPSM 21 transmitted light at a rate of approximately 35%. As a result, the EAPSM was able to meet the optical requirements of both inspection and exposure tools.

It is noted that the present invention is not limited to the specified exposure and inspection tool wavelengths discussed herein, and can be used with other inspection and exposure tool wavelengths either now in use or hereinafter developed. In this regard, as lithography road maps continue to use lower wavelengths, it is expected that inspection tools will be developed to use a smaller wavelength than the current wavelength 365 nm wavelength. For example, in the future, thin film stacks will need to be designed for use at 157 nm for EAPSM and for inspection at 248 nm or 257 nm. Beyond that, film stacks will need to be designed for the EUV wavelength of 13 nm and inspected at longer wavelengths. Thus, it should be apparent from the foregoing description that similar techniques at any set of wavelengths can be implemented by changing the material choices of the intermediate layer for each set.

Now that the preferred embodiments of the present invention have been shown and described in detail, various modifications and improvements thereon will become readily apparent to those skilled in the art. Accordingly, the spirit and scope of the present invention is to be construed broadly and limited only by the appended claims and not by the foregoing specification.

What is claimed is:

1. A blank photomask comprising:
   a photoresist layer forming a top layer of said blank photomask;
   a substantially transparent layer forming a bottom layer of said blank photomask;
   an opaque layer between said top and bottom layers of said photomask blank;
   a phase shift layer between said opaque and bottom layers of said photomask blank; and
   at least one intermediate layer between said opaque and substantially transparent layers, wherein said at least one intermediate layer is made from materials having a higher extinction coefficient at an inspection tool wavelength than at an exposure tool wavelength.

2. The blank photomask of claim 1, wherein said at least one intermediate layer is a metal-based material.

3. The blank photomask of claim 2, wherein said metal-based material is comprised of a material which is selected from one or more of the group consisting of: NiFe, Ir, Rh, Pd, Pt, Al, Cr, Ti, Au, V, Co, Ni, Fe, Cu, Ta, WN, TaSi, a-Si, TiSi, and Nb.

4. The blank photomask of claim 2, wherein said metal-based material has a k ratio approximately equal to 1.8.

5. The blank photomask of claim 1, wherein said phase shift layer has a thickness ranging from approximately 500 .ANG.–1000 .ANG. and said at least one intermediate layer has a thickness of approximately 50 .ANG.–150 .ANG.

6. The blank photomask of claim 1, wherein:
   said at least one intermediate layer is above said transparent layer;
   said phase shift layer is above said at least one intermediate layer;
   said opaque layer is above said phase shift layer; and
   said photoresist layer is above said opaque layer.

7. The blank photomask of claim 6, wherein said intermediate layer is aluminum.

8. The blank photomask of claim 6, wherein said intermediate layer is chromium.

9. The blank photomask of claim 6, wherein said phase shift layer is TaSiN and said at least one intermediate layer is Ti.

10. The blank photomask of claim 9, wherein said TaSiN phase layer has a thickness of approximately 680 .ANG. and said titanium intermediate layer has a thickness of approximately 75 .ANG.

11. The blank photomask of claim 6, wherein said phase shift layer is silicon nitride and said intermediate layer is amorphous silicon.

12. The blank photomask of claim 11, wherein said silicon nitride phase shift layer has a thickness of approximately 785 .ANG. and said amorphous silicon intermediate layer has a thickness of approximately 50 .ANG.

13. The blank photomask of claim 6, wherein said phase shift layer is silicon nitride and said intermediate layer is chromium nitride.

14. The blank photomask of claim 13, wherein said silicon nitride phase shift layer has a thickness of approximately 674 .ANG. and said chromium nitride intermediate layer has a thickness of approximately 115 .ANG.

15. The blank photomask of claim 1, wherein:
   said phase shift layer is above said transparent layer;
   said at least one intermediate layer above said phase shift layer;
   said opaque layer is above said at least one intermediate layer; and
   said photoresist layer is above said opaque layer.

16. The blank photomask of claim 15, wherein said phase shift layer is TaSiN and said at least one intermediate layer is Ti.

17. The blank photomask of claim 16, wherein said TaSiN phase layer has a thickness of approximately 680 .ANG. and said titanium intermediate layer has a thickness of approximately 75 .ANG.

18. The blank photomask of claim 1, wherein:
   said at least one intermediate layer comprises a first intermediate layer above said transparent layer and a second intermediate layer above said phase shift layer, wherein said phase shift layer is between said first and second intermediate layers;
   said opaque layer is above said second intermediate layer; and
   said photoresist layer is above said opaque layer.

19. The blank photomask of claim 18, wherein said first and second intermediate layers are aluminum and said phase shift layer is silicon nitride.

20. The blank photomask of claim 19, wherein said first and second aluminum intermediate layers have a thickness of approximately 50 .ANG. and said silicon nitride phase shift layer has a thickness of approximately 830 .ANG.

21. The blank photomask of claim 1, wherein said substantially transparent layer is quartz.

22. The blank photomask of claim 1, wherein said phase shift material comprises a material which is selected from the group consisting of MoSi, TaSiN, TiSiN and ZrSiO.

23. The blank photomask of claim 1, wherein said opaque layer is chrome.

24. The blank photomask of claim 1, wherein said photomask is tuned for 193 nm exposure tools.

25. A processed photomask comprising:
a substantially transparent layer forming a bottom of said blank photomask;
a patterned opaque layer forming a top layer of said processed photomask;
a patterned phase shift layer between said top and bottom layers of said photomask blank; and
at least one patterned intermediate layer between said opaque and substantially transparent layers, wherein said at least one intermediate layer is made from materials having a higher extinction coefficient at an inspection tool wavelength than at an exposure tool wavelength.

26. The processed photomask of claim 25, wherein said at least one intermediate layer is a metal-based material.

27. The processed photomask of claim 26, wherein said metal-based material comprises a material which is selected from one or more of the group consisting of: NiFe, Ir, Rh, Pd, Pt, Al, Cr, Ti, Au, V, Co, Ni, Fe, Cu, Ta, WN, TaSi, a-Si, TiSi, and Nb.

28. The processed photomask of claim 25, wherein said phase shift layer has a thickness ranging from approximately 500 .ANG.–1000 .ANG. and said at least one intermediate layer has a thickness of approximately 50 .ANG.–150 .ANG.

29. The processed photomask of claim 25, wherein:
said at least one intermediate layer is above said transparent layer;
said phase shift layer is above said at least one intermediate layer; and
said opaque layer is above said phase shift layer.

30. The blank photomask of claim 29, wherein said intermediate layer is aluminum.

31. The blank photomask of claim 29, wherein said intermediate layer is chromium.

32. The processed photomask of claim 25, wherein:
said phase shift layer is above said transparent layer;
said at least one intermediate layer above said phase shift layer; and
said opaque layer is above said at least one intermediate layer.

33. The processed photomask of claim 25, wherein:
said at least one intermediate layer comprises a first intermediate layer above said transparent layer and a second intermediate layer above said phase shift layer, wherein said phase shift layer is between said first and second intermediate layers; and
said opaque layer is above said second intermediate layer.

34. The blank photomask of claim 25, wherein said phase shift material comprises a material which is selected from the group consisting of MoSi, TaSiN, TiSiN and ZrSiO.

35. A blank photomask comprising:
a substantially transparent layer;
an intermediate layer above said substantially transparent layer, wherein said intermediate layer is made from materials having a higher extinction coefficient at an inspection tools wavelength than at an exposure tool wavelength;
a phase shift layer above said intermediate layer;
an opaque layer above said phase shift layer; and
a photoresist layer above said opaque layer.

36. The blank photomask of claim 35, wherein said at least one intermediate layer is a metal-based material.

37. The blank photomask of claim 36, wherein said metal-based material is comprised of a material which is selected from one or more of the group consisting of: NiFe, Ir, Rh, Pd, Pt, Al, Cr, Ti, Au, V, Co, Ni, Fe, Cu, Ta, WN, TaSi, a-Si, TiSi, and Nb.

38. The blank photomask of claim 35, wherein said phase shift layer has a thickness ranging from approximately 500 .ANG.–1000 .ANG. and said at least one intermediate layer has a thickness of approximately 50 .ANG.–150 .ANG.

39. The blank photomask of claim 35, wherein said phase shift material comprises a material which is selected from the group consisting of MoSi, TaSiN, TiSiN and ZrSiO.

40. A blank photomask comprising:
a substantially transparent layer;
a phase shift layer above said substantially transparent layer;
an intermediate layer above said phase shift layer, wherein said intermediate layer is made from materials having a higher extinction coefficient at an inspection tools wavelength than at an exposure tool wavelength;
an opaque layer above said intermediate layer; and
a photoresist layer above said opaque layer.

41. The blank photomask of claim 40, wherein said at least one intermediate layer is a metal-based material.

42. The blank photomask of claim 41, wherein said metal-based material comprises a material which is selected from one or more of the group consisting of: NiFe, Ir, Rh, Pd, Pt, Al, Cr, Ti, Au, V, Co, Ni, Fe, Cu, Ta, Mo, WN, TaSi, a-Si, TiSi, MoN and Nb.

43. The blank photomask of claim 40, wherein said phase shift layer has a thickness ranging from approximately 500 .ANG.–1000 .ANG. and said at least one intermediate layer has a thickness of approximately 50 .ANG.–150 ANG.

44. The blank photomask of claim 40, wherein said phase shift material comprises a material which is selected from the group consisting of MoSi, TaSiN, TiSiN and ZrSiO.

45. A blank photomask comprising:
a substantially transparent layer;
a first intermediate layer above said substantially transparent layer, wherein said first intermediate layer is made from materials having a higher extinction coefficient at an inspection tool wavelength than at an exposure tool wavelength;
a phase shift layer above said first intermediate layer;
a second intermediate layer above said phase layer, wherein said second intermediate layer is made from materials having a higher extinction coefficient at an inspection tools wavelength than at an exposure tool wavelength;
an opaque layer above said second intermediate layer; and
a photoresist layer above said opaque layer.

46. The blank photomask of claim 45, wherein said at first and second intermediate layers are metal-based materials.

47. The blank photomask of claim 46, wherein said metal-based materials comprise materials that are selected from one or more of the group consisting of: NiFe, Ir, Rh, Pd, Pt, Al, Cr, Ti, Au, V, Co, Ni, Fe, Cu, Ta, Mo, WN, TaSi, a-Si, TiSi, MoN and Nb.

48. The blank photomask of claim 45, wherein said phase shift layer has a thickness ranging from approximately 500 ANG.–1000 .ANG. and said at least one intermediate layer has a thickness of approximately 50 .ANG.–150 .ANG.

49. The blank photomask of claim 45, wherein said phase shift material comprises a material which is selected from the group consisting of MoSi, TaSiN, TiSiN and ZrSiO.

50. A method of manufacturing a photomask comprising the steps of providing a blank photomask having:
- a top layer of photoresist material;
- a bottom substantially transparent layer;
- an opaque layer between said top and bottom layers;
- a phase shift layer between said top and opaque layers; and
- at least one intermediate layer between said opaque and substantially transparent layers, wherein said intermediate layer is made from materials having a higher extinction coefficient at inspection tool wavelengths than at exposure tool wavelengths;
- processing said blank photomask to form a specific pattern;
- inspecting said processed photomask using an inspection tool.

51. The method of manufacturing a photomask of claim 50, wherein said processing step further comprises the steps of:
- writing a pattern to be etched on said layer of photoresist material;
- etching said pattern in said layer of photoresist material, said opaque layer, said phase shift layer and said at least one intermediate layer; and
- removing said photoresist material from said processed mask.

52. The method of manufacturing a photomask of claim 51, wherein said step of inspecting further comprises the steps of:
- directing an illumination beam at said photomask;
- detecting an intensity of said beam transmitted through and reflected back from said processed photomask;
- comparing said detected intensity with an expected light intensity;
- recording any deviation of said detected intensity from said expected intensity as a defect.

53. The method of manufacturing a photomask of claim 52, wherein said step of inspecting further comprises the steps of:
- directing an illumination beam at said photomask;
- detecting an intensity of said beam transmitted through and reflected back from said processed photomask;
- comparing the pattern in said processed photomask with a second pattern on a second photomask which has already been processed;
- recording any deviation of the pattern in said photomask from the second pattern on said second photomask as a defect.

54. The blank photomask of claim 50, wherein said at least one intermediate layer is a metal-based material.

55. The blank photomask of claim 54, wherein said metal-based material is selected from one or more of the group consisting of: NiFe, Ir, Rh, Pd, Pt, Al, Cr, Ti, Au, V, Co, Ni, Fe, Cu, Ta, Mo, WN, TaSi, a-Si, TiSi, MoN and Nb.

56. The blank photomask of claim 50, wherein said phase shift layer has a thickness ranging from approximately 500 .ANG.–1000 .ANG. and said at least one intermediate layer has a thickness of approximately 50 .ANG.–150 .ANG.

57. The blank photomask of claim 50, wherein:
- said at least one intermediate layer is above said transparent layer;
- said phase shift layer is above said at least one intermediate layer;
- said opaque layer is above said phase shift layer; and
- said photoresist layer is above said opaque layer.

58. The blank photomask of claim 57, wherein said intermediate layer is aluminum.

59. The blank photomask of claim 57, wherein said intermediate layer is chromium.

60. The blank photomask of claim 50, wherein:
- said phase shift layer is above said transparent layer;
- said at least one intermediate layer above said phase shift layer;
- said opaque layer is above said at least one intermediate layer; and
- said photoresist layer is above said opaque layer.

61. The blank photomask of claim 50, wherein:
- said at least one intermediate layer comprises a first intermediate layer above said transparent layer and a second intermediate layer above said phase shift layer, wherein said phase shift layer is between said first and second intermediate layers;
- said opaque layer is above said second intermediate layer; and
- said photoresist layer is above said opaque layer.

62. The blank photomask of claim 50, wherein said phase shift material is selected from the group consisting of MoSi, TaSiN, TiSiN and ZrSiO.

63. A method of manufacturing a semiconductor device comprising the steps of:
- interposing a finished photomask between a semiconductor wafer and an energy source, wherein said finished photomask comprises a bottom substantially transparent substrate;
- a top patterned opaque layer forming a specific pattern;
- a patterned phase shift layer between said top and bottom layers layer forming said specific pattern;
- and at least one patterned intermediate layer between said opaque and substantially transparent layers and forming said specific pattern, wherein said at least one patterned intermediate layer is made from materials having an extinction coefficient that is higher at an inspection tool wavelength than at an exposure tool wavelength;
- generating energy in the energy source;
- transmitting said generated energy through said patterns formed in said opaque, phase shift and at least one intermediate layers of said finished photomask to said semiconductor wafer;
- and etching an image on said semiconductor wafer corresponding to said patterns formed in said opaque, phase shift and at least one intermediate layers of said finished photomask.

64. The method of manufacturing a semiconductor device of claim 63, wherein said at least one intermediate layer is a metal-based material.

65. The blank photomask of claim 64, wherein said metal-based material is selected from one or more of the group consisting of: NiFe, Ir, Rh, Pd, Pt, Al, Cr, Ti, Au, V, Co, Ni, Fe, Cu, Ta, Mo, WN, TaSi, a-Si, TiSi, MoN and Nb.

66. The blank photomask of claim 63, wherein said phase shift layer has a thickness ranging from approximately 500 .ANG.–1000 .ANG. and said at least one intermediate layer has a thickness of approximately 50 .ANG.–150 .ANG.

67. The blank photomask of claim 63, wherein:
- said at least one intermediate layer is above said transparent layer;

said phase shift layer is above said at least one intermediate layer;

said opaque layer is above said phase shift layer; and said photoresist layer is above said opaque layer.

68. The blank photomask of claim 67, wherein said intermediate layer is aluminum.

69. The blank photomask of claim 67, wherein said intermediate layer is chromium.

70. The blank photomask of claim 63, wherein:

said phase shift layer is above said transparent layer;

said at least one intermediate layer above said phase shift layer;

said opaque layer is above said at least one intermediate layer; and said photoresist layer is above said opaque layer.

71. The blank photomask of claim 63, wherein:

said at least one intermediate layer comprises a first intermediate layer above said transparent layer and a second intermediate layer above said phase shift layer, wherein said phase shift layer is between said first and second intermediate layers;

said opaque layer is above said second intermediate layer; and said photoresist layer is above said opaque layer.

72. The blank photomask of claim 63, wherein said phase shift material is selected from the group consisting of MoSi, TaSiN, TiSiN and ZrSiO.

* * * * *